US008529867B2

(12) United States Patent
Fullerton

(10) Patent No.: US 8,529,867 B2
(45) Date of Patent: Sep. 10, 2013

(54) ALUMINUM-ALKALI HYDROXIDE RECYCLABLE HYDROGEN GENERATOR

(75) Inventor: Larry W. Fullerton, New Hope, AL (US)

(73) Assignee: Cedar Ridge Research, LLC, Huntsville, AL (US)

(*) Notice: Subject to any disclaimer, the term of this patent is extended or adjusted under 35 U.S.C. 154(b) by 326 days.

(21) Appl. No.: 12/417,450

(22) Filed: Apr. 2, 2009

(65) Prior Publication Data

US 2009/0252671 A1 Oct. 8, 2009

Related U.S. Application Data

(60) Provisional application No. 61/072,748, filed on Apr. 2, 2008.

(51) Int. Cl.
*C01B 3/08* (2006.01)
*B01J 7/00* (2006.01)

(52) U.S. Cl.
USPC ............................... 423/657; 48/61

(58) Field of Classification Search
USPC .......................................................... 423/657
See application file for complete search history.

(56) References Cited

U.S. PATENT DOCUMENTS

| 909,536 | A | * | 1/1909 | Brindley | 252/188.25 |
|---|---|---|---|---|---|
| 2,271,789 | A | * | 2/1942 | White | 198/716 |
| 2,721,789 | A | * | 10/1955 | Gill | 422/202 |
| 4,543,246 | A | | 9/1985 | Houser | |
| 5,143,047 | A | | 9/1992 | Lee | |
| 5,279,260 | A | | 1/1994 | Munday | |
| 5,455,019 | A | | 10/1995 | Inui et al. | |
| 5,817,157 | A | | 10/1998 | Checketts | |
| 6,251,237 | B1 | | 6/2001 | Bos et al. | |
| 6,418,745 | B1 | | 7/2002 | Ratliff | |
| 6,461,752 | B1 | | 10/2002 | Leung | |
| 6,506,360 | B1 | * | 1/2003 | Andersen et al. | 423/657 |
| 6,638,493 | B2 | * | 10/2003 | Andersen et al. | 423/657 |
| 6,899,862 | B2 | * | 5/2005 | Baldwin et al. | 423/657 |
| 7,493,765 | B2 | * | 2/2009 | Akiyama et al. | 60/721 |
| 7,524,342 | B2 | * | 4/2009 | Brinkley, III | 48/61 |
| 7,803,349 | B1 | * | 9/2010 | Muradov | 423/657 |
| 8,021,793 | B2 | * | 9/2011 | Nakai et al. | 429/416 |

(Continued)

OTHER PUBLICATIONS

Notification Concerning Transmittal of International Preliminary Report on Patentability, issued in International Application No. PCT/US09/002051, dated Oct. 14, 2010.

(Continued)

*Primary Examiner* — Wayne Langel
(74) *Attorney, Agent, or Firm* — Venable LLP; Robert S. Babayi; Thomas A. Negley

(57) ABSTRACT

An aluminum-alkali hydroxide recyclable hydrogen generator is provided that enables generation of hydrogen for a consuming apparatus on demand. The hydrogen generator includes a source of aluminum, a source of a hydroxide, a source of water, and a reaction chamber, where the amount of at least one of the aluminum, sodium hydroxide, and water that is introduced into the reaction chamber is used to limit the chemical reaction to control the amount of hydrogen generated.

1 Claim, 13 Drawing Sheets

(56) References Cited

U.S. PATENT DOCUMENTS

| | | | |
|---|---|---|---|
| 2001/0053346 A1* | 12/2001 | Baldwin et al. | 423/657 |
| 2002/0048548 A1* | 4/2002 | Chaklader | 423/657 |
| 2004/0089486 A1 | 5/2004 | Harrup et al. | |
| 2004/0115125 A1 | 6/2004 | Andersen | |
| 2004/0131541 A1* | 7/2004 | Andersen | 423/657 |
| 2005/0232837 A1* | 10/2005 | Troczynski et al. | 423/155 |
| 2007/0044379 A1* | 3/2007 | Giroux | 48/61 |
| 2008/0030924 A1 | 2/2008 | Mori et al. | |
| 2010/0028255 A1* | 2/2010 | Hatoum | 423/657 |
| 2010/0150826 A1* | 6/2010 | Troczynski et al. | 423/657 |
| 2010/0173225 A1* | 7/2010 | Rosenband et al. | 429/502 |

OTHER PUBLICATIONS

International Preliminary Report on Patentability, issued in International Application No. PCT/US09/02051, dated Oct. 5, 2010.

Written Opinion of the International searching Authority, issued in International Application No. PCT/US09/02051, dated Nov. 9, 2009.

International Search Report and Written Opinion issued in International Application No. PCT/US09/02051, dated Nov. 9, 2009.

Office Action issued by the State Intellectual Property Office of P.R. China in counterpart Chinese Application No. 200980120079.9 dated Oct. 10, 2012.

* cited by examiner

ALUMINUM-ALKALI HYDROXIDE RECYCLABLE HYDROGEN GENERATOR

CROSS-REFERENCE TO RELATED APPLICATIONS

This United States Non-provisional Application claims the benefit of U.S. Provisional Application Ser. No. 61/072,748, filed Apr. 2, 2008, titled "Aluminum-Alkali Hydroxide Recyclable Hydrogen Generator", which is incorporated by reference herein in its entirety.

FIELD OF THE INVENTION

The present invention relates generally to a hydrogen generator. More particularly, the present invention relates to a hydrogen generator that controls a substantially reactant-limited chemical reaction between aluminum, an alkali metal hydroxide, and water to produce hydrogen gas when and where needed by a consuming apparatus.

BACKGROUND OF THE INVENTION

Due to a combination of the energy crisis and carbon dioxide-induced global warming it has become a national imperative to create a mode of common transportation that relies on the element hydrogen as its portable fuel. As efficient and desirable as hydrogen may be as a transport mechanism to transfer energy from point A to point B, it has tremendous downsides when it comes to its storage and transportation. To date, compressed hydrogen and liquid hydrogen are the two methods being put forward as workable solutions. Compressed hydrogen (at 5,000 to 10,000 pounds per square inch—PSI) is considered dangerous by the consuming public, and would be very expensive to distribute via costly compressed hydrogen filling stations. The same holds true for liquid hydrogen that must be maintained at less than minus 400 degrees Fahrenheit, where a decade and hundreds of billions of dollars would be required for installation of an infrastructure equal to that of today's gasoline stations.

Therefore there is a need for an improved system and method for providing hydrogen as a portable fuel.

SUMMARY OF THE INVENTION

Briefly, the present invention is an aluminum-alkali hydroxide recyclable hydrogen generator based on a chemical reaction of three reactants, aluminum, hydroxide, and water, where the hydrogen generator is integrated with a consuming apparatus. The hydrogen generator includes a source of aluminum, a source of a hydroxide, a source of water, and a reaction chamber for combining aluminum, hydroxide, and water to produce hydrogen in a substantially reactant-limited chemical reaction, where the amount of at least one of the aluminum, hydroxide, and water that is introduced into the reaction chamber limits the chemical reaction and therefore determines the amount, if any, of hydrogen generated or otherwise evolved by the hydrogen generator. The hydrogen produced by the hydrogen generator can be used to fuel combustion engines, turbines, fuel cells, as a supplement to diesel fuel, and for other purposes, and the heat produced by the chemical reaction can be used to heat water, air, fluids, etc. and can be used with a heat pump to cool water, air, fluids, etc. Generally, the substantially reactant-limited chemical reaction can be controlled (or limited) in accordance with the use of the hydrogen such that hydrogen is generated when and where it is needed by the consuming apparatus (i.e., hydrogen is generated on demand).

The formula for the substantially reactant-limited chemical reaction is $2Al+2XOH+2H_2O \rightarrow XAlO_2+3H_2+$an amount of produced heat, wherein X is at least one alkali metal comprising at least one of lithium, sodium, potassium, rubidium, cesium, or francium and where the amount of produced heat corresponds to the at least one alkali metal. For sodium, the formula for the substantially reactant-limited chemical reaction is $2Al+2NaOH+2H_2O \rightarrow NaAlO_2+3H_2+831.2$ kJ heat.

The hydrogen generator enables hydrogen to be compactly stored as an inert gel or paste that is the equivalent of 44,000 PSI in volume or displacement. The hydrogen generator safely delivers its hydrogen on demand as needed at atmospheric pressure and its fueling mechanism can be stored cheaply literally anywhere as it is totally safe and inert.

With this arrangement, a distribution paradigm is possible including home delivery and new inexpensive retail distribution locations at a fraction of the cost of compressed or liquid hydrogen storage. There are little if any safety or environmental restrictions on this inert fueling mechanism made of aluminum, hydroxide, and water and the corresponding hydrogen generator.

The reaction chamber of the hydrogen generator includes at least one inlet for receiving at least one of the aluminum, the hydroxide, or the water. At least one of the aluminum, the hydroxide, or the water can be provided to the reaction chamber prior to the reaction chamber receiving at least one of the aluminum, the hydroxide, or the water from the at least one inlet. Alternatively, the aluminum, the hydroxide, and the water can be added at the same time. Any two the aluminum, the hydroxide, and the water can be mixed prior before the mixture is added to the reaction chamber.

The source of hydroxide and the source of water could be a solution of hydroxide and water, for example, a solution of 74 grams of sodium hydroxide and 100 ml of water. The hydrogen generator may include a flow control mechanism for controlling a flow rate of the solution.

The source of aluminum and the source of the hydroxide can be a mixture comprising aluminum and hydroxide. The mixture may also include a binder that keeps the aluminum and the hydroxide in a desired stoichiometric ratio. A binder may include one of an anti-caking agent, a flowing agent, a talcum powder, diatomaceous earth, calcium silicate, silica, calcium oxide, a silicone-based binder, a powdered sodium silicate, bismuth, a bismuth alloy, a paraffin, a thermoplastic, a thermo adhesive, a petroleum distillate, a rosin, a lead-based binder, an indium-based binder, or a wax. The binder may substantially prevent water from reacting with the aluminum and the hydroxide.

A binder release mechanism may be used to release the binder from the mixture, where the binder release mechanism comprises at least one of heat, water, or a solvent. The binder release mechanism may require both heat and a solvent and the binder release mechanism may require the heat to be at a temperature greater than the boiling point of water. The solvent can be substantially water soluble. The solvent may be one of an alcohol, a petroleum distillate, acetone, a chlorinated hydrocarbon, a detergent, keytone, an ester, an organic solvent, an acid, a terpene, a cyclic hydrocarbon, a polycyclic hydrocarbon, or an aldehyde.

The aluminum can be in the form of at least one of a paste, a gel, a pellet, a powder, a wire, or a rod.

The hydrogen generator may include a control mechanism for controlling the amounts of the aluminum, the hydroxide, and the water in the substantially reactant-limited chemical reaction.

The hydrogen generator may include a source of heat, where the source of heat may be used to speed the initial rate of reaction.

The hydrogen generator may include a heat exchange mechanism for receiving heat produced by the substantially reactant-limited chemical reaction. The heat exchange mechanism may be at least one of a vessel containing a heat exchange fluid and a metal structure. The vessel can be an open or closed vessel and the heat exchange fluid can be water, silicon, ethylene glycol, a ethylene glycol solution, or oil. The hydrogen generator may include a thermoelectric generator that receives heat from said heat exchange mechanism and produces electricity. The hydrogen generator may also include a hydrolysis cell that receives electricity from the thermoelectric generator.

The hydrogen generator of may include a waste reservoir for receiving a waste solution from the substantially reactant-limited chemical reaction. Aluminum can be added to the waste solution of the waste reservoir to produce hydrogen.

The hydrogen generator may include a precipitator that precipitates aluminum hydroxide from the waste solution. The hydrogen generator may also include an alumina generator that heats the precipitated aluminum hydroxide to generate alumina and water and an aluminum generator that uses the Hall-Héroult process to produce aluminum from the alumina.

The alumina generator may receive heat produced by the substantially reactant-limited chemical reaction, which is an exothermic chemical reaction. The source of water may include the alumina generator. The aluminum generator can be provided electricity generated from heat produced by the substantially reactant-limited chemical reaction and can be provided heat produced by the substantially reactant-limited chemical reaction.

The hydrogen generator may include at least one pump. The at least one pump may include at least one of a flow pump or a pressure pump.

The hydrogen generator may be used to provide hydrogen fuel to at least one of a fuel cell, a combustion engine, a turbine, a diesel engine, an automobile, a truck, an emergency vehicle, a construction equipment, an inboard boat motor, an outboard boat motor, a ship, a barge, a locomotive, a motorcycle, a bicycle, a semi-truck, a submarine, a farming equipment, a forklift, a helicopter, a rocket, a garbage truck, a bus, a wheel chair, an industrial engine, a back-up power unit, a trucking industry alternative power unit, an emergency generator, or a military equipment.

Heat generated by the substantially reactant-limited chemical reaction can be used to heat at least one of an interior of a building, a body of water, a cabin of a vehicle, an interior of a tent, an interior of a temporary structure, or an engine and can be provided to a heat pump that is used to cool at least one of an interior of a building, a body of water, a cabin of a vehicle, an interior of a tent, an interior of a temporary structure, or an engine.

The hydrogen generator can be combined with a combustion engine that receives the hydrogen and produces steam and a condenser that receives the steam and produces recovered water. A water filter can also be used to filter the recovered water.

The present invention is also a method for generating hydrogen including the steps of providing aluminum, hydroxide, and water to a reaction chamber integrated with a consuming apparatus and controlling the amount of at least one of the aluminum, the hydroxide, and the water provided to the reaction chamber to control a substantially reactant-limited chemical reaction between the aluminum, the hydroxide, and the water to control generation of the hydrogen when and where it is being consumed by the consuming apparatus.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
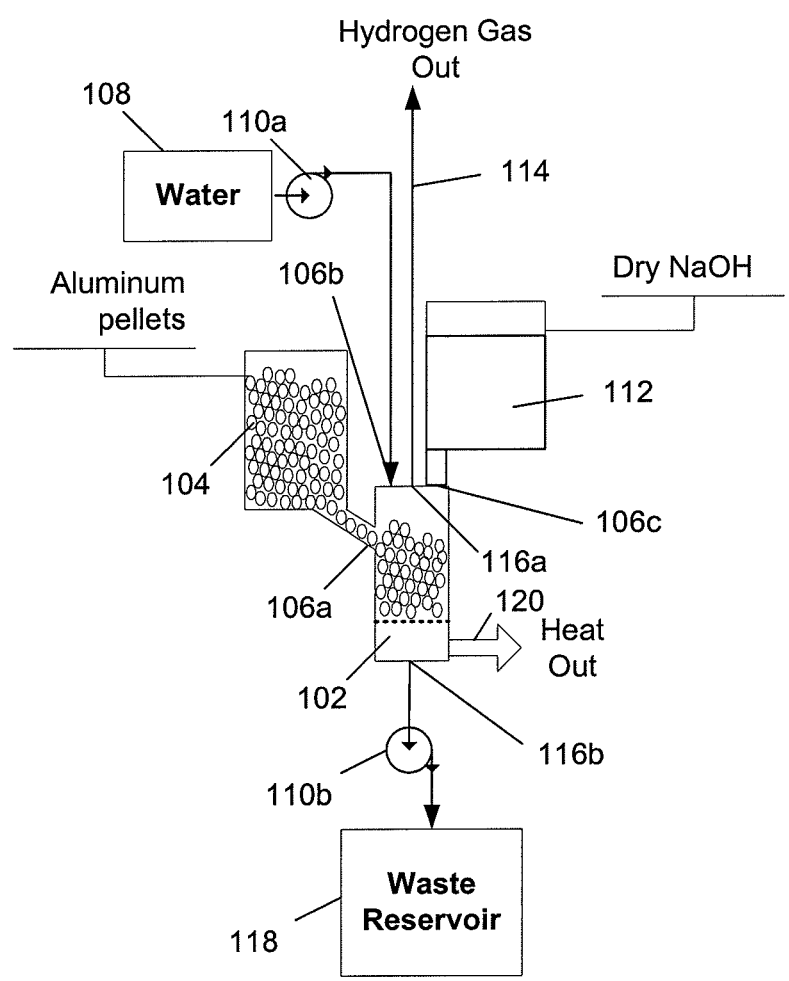
FIG. 1 depicts a first embodiment of a hydrogen generator having a chemical reactor that receives aluminum from a first inlet, water from a second inlet, and sodium hydroxide from a third inlet, and outputs hydrogen, a waste solution, and heat.

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art. Like numbers refer to like elements throughout.

The present invention provides an improved hydrogen generator integrated with a consuming apparatus. The hydrogen generator relies on a substantially reactant-limited chemical reaction between aluminum metal, an alkali metal hydroxide, and water within a reactor that produces hydrogen gas for the consuming apparatus on demand. Specifically, the hydrogen generator is based on a chemical reaction of three reactants, aluminum, hydroxide, and water. The hydrogen generator includes a source of aluminum, a source of a hydroxide, a source of water, and a reaction chamber for combining aluminum, hydroxide, and water to produce hydrogen in a substantially reactant-limited chemical reaction, where the amount of at least one of the aluminum, hydroxide, and water that is introduced into the reaction chamber limits the chemical reaction and therefore determines the amount, if any, of hydrogen evolved by the hydrogen generator. The chemical reaction also produces heat and a waste solution that can be processed to reproduce aluminum, the alkali metal hydroxide, and water. The substantially reactant-limited chemical reaction can be controlled or limited in accordance with the use of the generated hydrogen by the consuming apparatus so that the hydrogen can be generated on demand. The invention's ability to limit and control the substantially reactant-limited chemical reaction so that hydrogen can be generated where and when it is needed by a consuming apparatus provides a safe and efficient hydrogen source that does not require the expensive infrastructure of compressed or liquid hydrogen. According to one embodiment, carbon can be applied to the system and method of the present invention as part of a recycling system.

In other words, the present invention provides an improved hydrogen generator that relies on a substantially reactant-limited chemical reaction between aluminum metal, an alkali metal hydroxide, and water within a reactor that produces hydrogen gas on demand. Specifically, the hydrogen generator is based on a chemical reaction of three reactants, aluminum, hydroxide, and water. The chemical reaction is substantially reactant-limited by controlling the amount of at least one of the reactants introduced into a reaction chamber. Thus, the reactant(s) that is used to control the chemical reaction determines the amount of hydrogen that is evolved by the hydrogen generator. The hydrogen generator includes a source of aluminum, a source of a hydroxide, a source of water, and a reaction chamber for combining aluminum, hydroxide, and water to produce hydrogen in a substantially reactant-limited chemical reaction, where the amount of at least one of the aluminum, hydroxide, and water that is introduced into the reaction chamber limits the chemical reaction and therefore determines the amount, if any, of hydrogen evolved by the hydrogen generator. The chemical reaction also produces heat and a waste solution that can be processed to reproduce aluminum, the alkali metal hydroxide, and water. As such, the invention provides a safe and efficient hydrogen source that does not require the expensive infrastructure of compressed or liquid hydrogen.

The chemical reaction underlying this invention is:

$$2Al + 2XOH + 2H_2O \rightarrow XAlO_2 + 3H_2 + 831.2 \text{ kJ of heat}$$
(for X=Na)

where X is an alkali metal.

The alkali metal sodium, or Na, will be used herein as the alkali metal for exemplary purposes, but it should be understood by someone skilled in the art that any other suitable metal host for the hydroxide (OH) ion may be used, or any mixture thereof. Prominent examples of suitable metals are sodium, potassium and lithium. Lithium is particularly a prominent choice as it greatly reduces the weight of a portable generator. Other possible host metals are rubidium, cesium, and francium.

This chemical reaction, controlled according to the present invention, is highly reversible by the application of carbon and electric current to the processed waste product. In effect, this aspect of the invention is analogous to a rechargeable electric battery except in this case the energy stored is in the form of hydrogen gas rather than electric current.

To recycle the cell, aluminum hydroxide is first precipitated from the waste solution of precipitated sodium aluminate. This process also recovers a solution of sodium hydroxide which may then be dried for further processing. The precipitated aluminum hydroxide is then heated to form alumina by driving out the water where:

$$2Al(OH)_3 + \text{heat} \rightarrow Al_2O_3 + 3H_2O$$

The chemical process used to recover the aluminum metal from the alumina is:

$$2Al_2O_3 + 3C + \text{electric current}(12e^-) \rightarrow 4Al + 3CO_2$$

This aluminum recovery process is known as the Hall-Héroult process, which is presently the main method used to produce aluminum commercially. One step of the Hall-Héroult process is to produce the alumina using a chemical process called the Bayer process in which bauxite, or aluminum ore, is converted to sodium aluminate followed by the conversion to alumina. Under the present invention the Hall-Héroult process is simplified by elimination of the Bayer process, this is because the waste product of the hydrogen generator of the invention is sodium aluminate so the Bayer process is not needed and the simplified Hall-Héroult process only requires using the alumina from the waste solution.

In order to provide hydrogen to a consuming apparatus, for example, an automobile or an electric generator or fuel cell, the reactants aluminum, sodium hydroxide and water are brought into contact with each other in a chemical reactor integrated with the consuming apparatus. When this is accomplished, the generated hydrogen gas may be captured via a variety of methods. Preferably, the generated solution is further process as described below.

FIG. 1 depicts a first embodiment of a hydrogen generator 100 having a chemical reactor that receives aluminum from a first inlet, water from a second inlet, and sodium hydroxide from a third inlet, and outputs hydrogen, a waste solution, and heat. Referring to FIG. 1, the hydrogen generator 100 includes a reactor (or reaction chamber or reaction cell) 102, an aluminum source 104 that provides aluminum to the reactor via a first inlet 106a, a water source 108 and a first pump 110a that pumps water from the water source into the reactor via a second inlet 106b, and a sodium hydroxide source 112 that provides sodium hydroxide to the reactor via a third inlet 106c. The hydrogen generator 100 outputs hydrogen 114 from a first outlet 116a, and a waste solution is pumped out of a second outlet 116b by a second pump 110b into a waste reservoir 118. Heat 120 produced by the chemical reaction is not captured and is instead allowed to escape into the surrounding environment.

The configuration of the hydrogen generator 100 allows the combining of the three reactants aluminum, water, and sodium hydroxide to be accomplished in several different ways in order to achieve and control the substantially reactant-limited chemical reaction. In one approach, the three reactants are provided to the reactor one at a time to cause the chemical reaction, where the three reactants can be provided in any order (A) 1. Al 2. $H_2O$ 3. NaOH, (B) 1. Al 2. NaOH 3. $H_2O$, (C) 1. $H_2O$ 2. NaOH 3. AL, (D) 1. $H_2O$ 2. Al 3. NaOH, (E) 1. NaOH 2. AL 3. $H_2O$, (F) 1. NaOH 2. $H_2O$ 3. Al), where the rate at which the last reactant is added determines the rate of the generated hydrogen. In another approach, one of the reactants can be provided to the reactor initially and then the other two reactants can be provided at the same time (i.e., (A) 1. Al 2. $H_2O$+NaOH, (B) 1. $H_2O$ 2. NaOH+Al, (C) 1. NaOH, 2. Al+$H_2O$), where the rate at which the last two reactants are added determines the rate of the generated hydrogen. With yet another approach, two of the reactants can be initially provided to the reactor at the same time and then the third reactant can be added to cause the chemical reaction (i.e., (A) 1. $H_2O$+NaOH 2. Al, (B) 1. NaOH+Al 2. $H_2O$, (C) 1. Al+$H_2O$, 2. NaOH), where the rate at which the last reactant is added determines the rate of the generated hydrogen. With still another approach the three reactants are added to the reactor at the same time where the rates that the three reactants are added determine the rate of the generated hydrogen. Depending on the approach employed, various types of well known mechanisms may be used within the reactor 102 as necessary to mix the reactants.

With each of the approaches, water may be combined with a dry aluminum and a dry sodium hydroxide when hydrogen is needed. When combined, the three reactants will react and generate hydrogen gas, which may then be collected in a suitable manner. The Al and NaOH reactants may each be in the form of a powder that can be mixed. Alternatively, they may separately or as a combination be formed into solid forms such as pellets, rods, granules, beads, tubes, paste etc. The latter methods will afford much better water flow through the reaction cell. The resulting liquid solution may be allowed to accumulate in a waste reservoir. The resulting solution may also be reprocessed, for example, by being circulated via a pump described in relation to FIG. 7.

Figure 2:
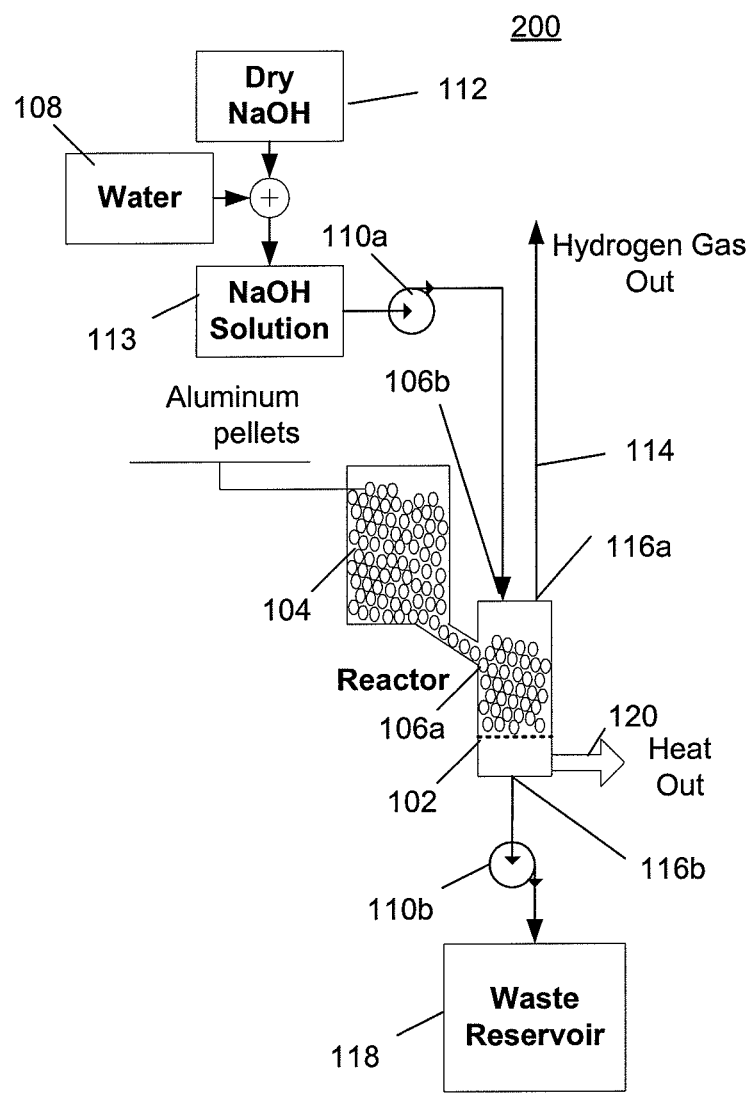
FIG. 2 depicts a second embodiment of a hydrogen generator having a chemical reactor that receives aluminum from a first inlet and a solution of water and sodium hydroxide from a second inlet, and outputs hydrogen, a waste solution, and heat.

FIG. 2 depicts a second embodiment of a hydrogen generator 200 having a chemical reactor that receives aluminum from a first inlet and a solution of water and sodium hydroxide from a second inlet, and outputs hydrogen, a waste solution, and heat. The solution of hydroxide and water can be, for example, a solution of 74 grams of sodium hydroxide and 100 ml of water, which represents the practical maximum ratio of dissolved sodium hydroxide to water at room temperature. At higher temperatures, a higher ratio of sodium hydroxide to water can be used but doing so would become impractical if the solution were to cool to room temperature when crystallization of a significant quantity of the sodium hydroxide would occur, which would be undesirable. Referring to FIG. 2, the hydrogen generator 200 includes a reactor 102, an aluminum source 104 that provides aluminum to the reactor via a first inlet 106a, a water source 108 and a sodium hydroxide source 112 that provide water and sodium hydroxide that is mixed into a NaOH solution 113 that is pumped by a first pump 110a into the reactor 102 via a second inlet 106b. The hydrogen generator 200 outputs hydrogen 114 from a first outlet 116a, and a waste solution is pumped out of a second outlet 116b by a second pump 110b into a waste reservoir 118. Heat 120 produced by the chemical reaction is not captured and is instead allowed to escape into the surrounding environment.

The hydrogen generator 200 can combine aluminum with the NaOH solution in various ways in order to achieve and control the substantially reactant-limited chemical reaction according to the present invention. In a first approach, aluminum may be added to a NaOH solution previously provided to the reactor, where the rate of introduction of the aluminum into the reactor determines the rate at which hydrogen is generated. In a second approach, the NaOH solution may be added to aluminum previously provided to the reactor, where the rate at which the NaOH solution is pumped through the reservoir determines the rate at which hydrogen is generated. In a third approach, the aluminum and the sodium hydroxide solution are provided to the reactor at the same time, where the rate of introduction of the aluminum and the rate of introduction of the NaOH solution determines the rate at which hydrogen is generated. One aspect of the hydrogen generator 200 of FIG. 2 is that the water and dry NaOH can be mixed to achieve a solution having a proper ratio of reactants.

Figure 3:
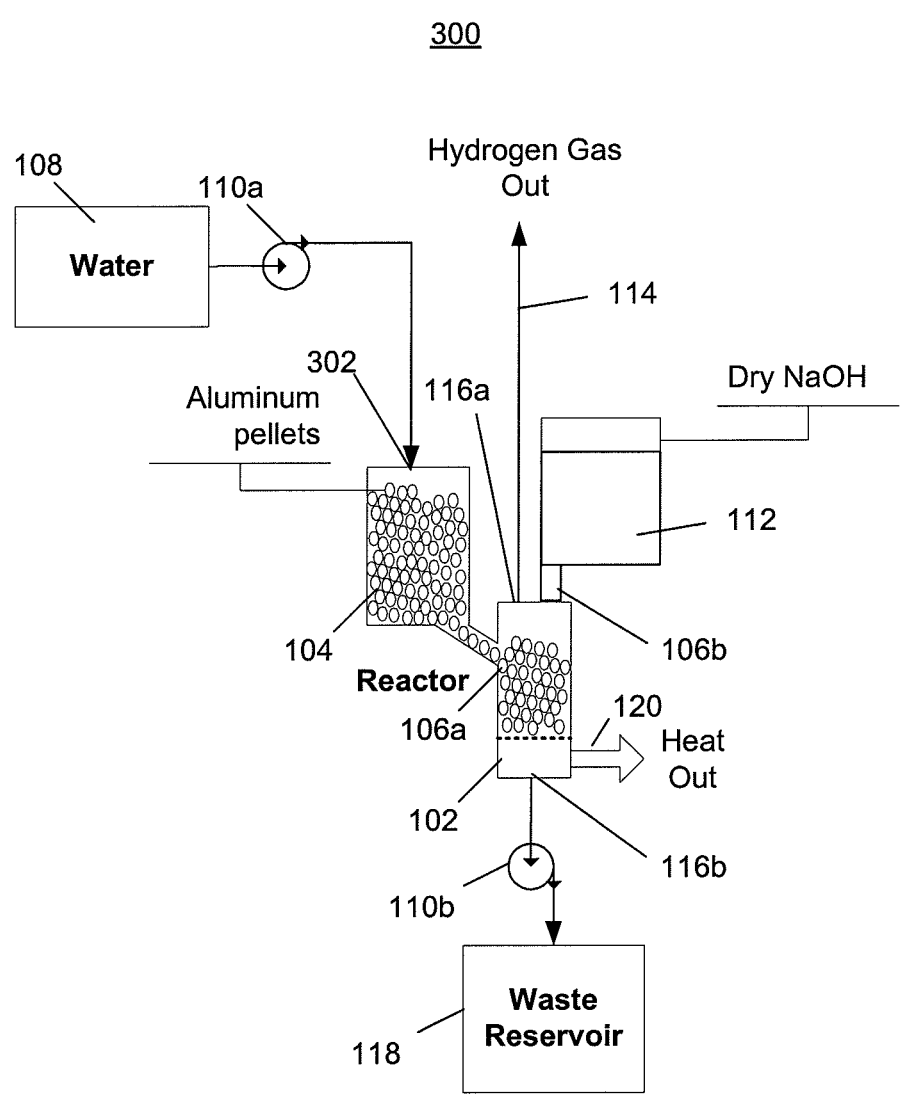
FIG. 3 depicts a third embodiment of a hydrogen generator having a chemical reactor that receives aluminum and water from a first inlet and sodium hydroxide from a second inlet, and outputs hydrogen, a waste solution, and heat.

FIG. 3 depicts a third embodiment of a hydrogen generator 300 having a chemical reactor that receives aluminum and water from a first inlet and sodium hydroxide from a second inlet, and outputs hydrogen, a waste solution, and heat. Referring to FIG. 3, the hydrogen generator 300 includes a reactor 102, an aluminum source 104 that provides aluminum to the reactor via a first inlet 106a, a water source 108 and a first pump 110a that pumps water from the water source into the aluminum source 104 via an opening 302 and a sodium hydroxide source 112 of dry sodium hydroxide that is provided to the reactor 102 via a second inlet 106b. The hydrogen generator 300 outputs hydrogen 114 from a first outlet 116a, and a waste solution is pumped out of a second outlet 116b by a second pump 110b into a waste reservoir 118. Heat 120 produced by the chemical reaction is not captured and is instead allowed to escape into the surrounding environment.

The hydrogen generator 300 of FIG. 3 can combine the aluminum and water with the dry NaOH in various ways in order to achieve and control the substantially reactant-limited chemical reaction in accordance with the invention. In a first approach, aluminum and water may be added to sodium hydroxide previously provided to the reactor, where the rate of introduction of the aluminum and water into the reactor determines the rate at which hydrogen is generated. In a second approach, the dry NaOH may be added to aluminum and water previously provided to the reactor where the rate at which the NaOH is provided to the reactor determines the rate at which hydrogen is generated. In a third approach, the aluminum and water and the dry NaOH are provided to the reactor at the same time, where the rate of introduction of the aluminum and water and the rate of introduction of the dry NaOH determines the rate at which hydrogen is generated. One aspect of the hydrogen generator 300 of FIG. 3 is that the force of the water being pumped into the aluminum source can be used to control the rate at which the combined aluminum and water are provided to the reactor.

Figure 4:
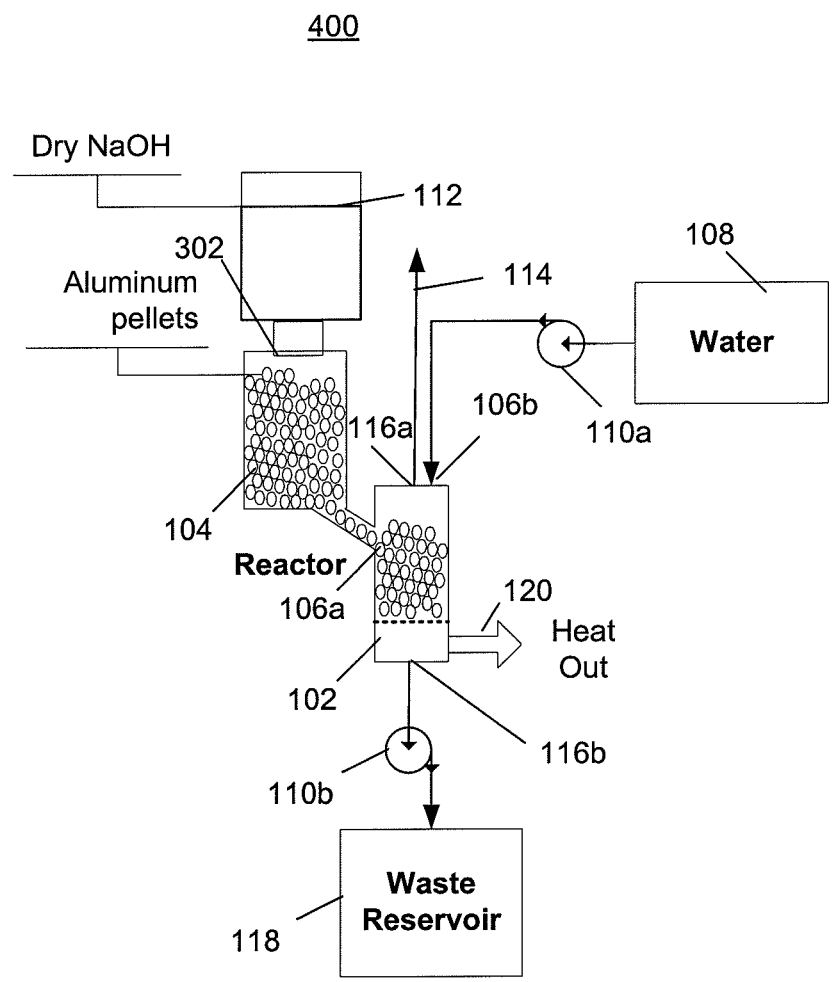
FIG. 4 depicts a fourth embodiment of a hydrogen generator having a chemical reactor that receives aluminum and sodium hydroxide from a first inlet and water from a second inlet, and outputs hydrogen, a waste solution, and heat.

FIG. 4 depicts a fourth embodiment of a hydrogen generator having a chemical reactor that receives aluminum and sodium hydroxide from a first inlet and water from a second inlet, and outputs hydrogen, a waste solution, and heat. Referring to FIG. 4, the hydrogen generator 400 includes a reactor 102, an aluminum source 104 that provides aluminum to the reactor via a first inlet 106a, a sodium hydroxide source 112 of dry sodium hydroxide that is provided to the aluminum source 104 via an opening 302, a water source 108, and a first pump 110a that pumps water from the water source into the reactor 102 via a second inlet 106b. The hydrogen generator 400 outputs hydrogen 114 from a first outlet 116a, and a waste solution is pumped out of a second outlet 116b by a second pump 110b into a waste reservoir 118. Heat 120 produced by the chemical reaction is not captured and is instead allowed to escape into the surrounding environment.

FIG. 4 depicts a hydrogen generator 400 that can combine the aluminum and dry NaOH with the water in various ways in order to achieve and control the substantially reactant-limited chemical reaction in accordance with the invention. In a first approach, aluminum and sodium hydroxide are mixed and added to water previously provided to the reactor, where the rate of introduction of the aluminum and sodium hydroxide mixture into the reactor determines the rate at which hydrogen is generated. In a second approach, the water may be added to aluminum and sodium hydroxide that was previously mixed and provided to the reactor where the rate at which the water is provided to the reactor determines the rate at which hydrogen is generated. In a third approach, the aluminum and the dry NaOH and the water are provided to the reactor at the same time, where the rate of introduction of the aluminum and dry NaOH and the rate of introduction of the water determines the rate at which hydrogen is generated. One aspect of the hydrogen generator 400 of FIG. 4 is that the aluminum and dry NaOH can be carefully mixed to achieve a proper ratio of reactants in a manner similar to the NaOH and water solution of the hydrogen generator 200 of FIG. 2.

Figure 5:
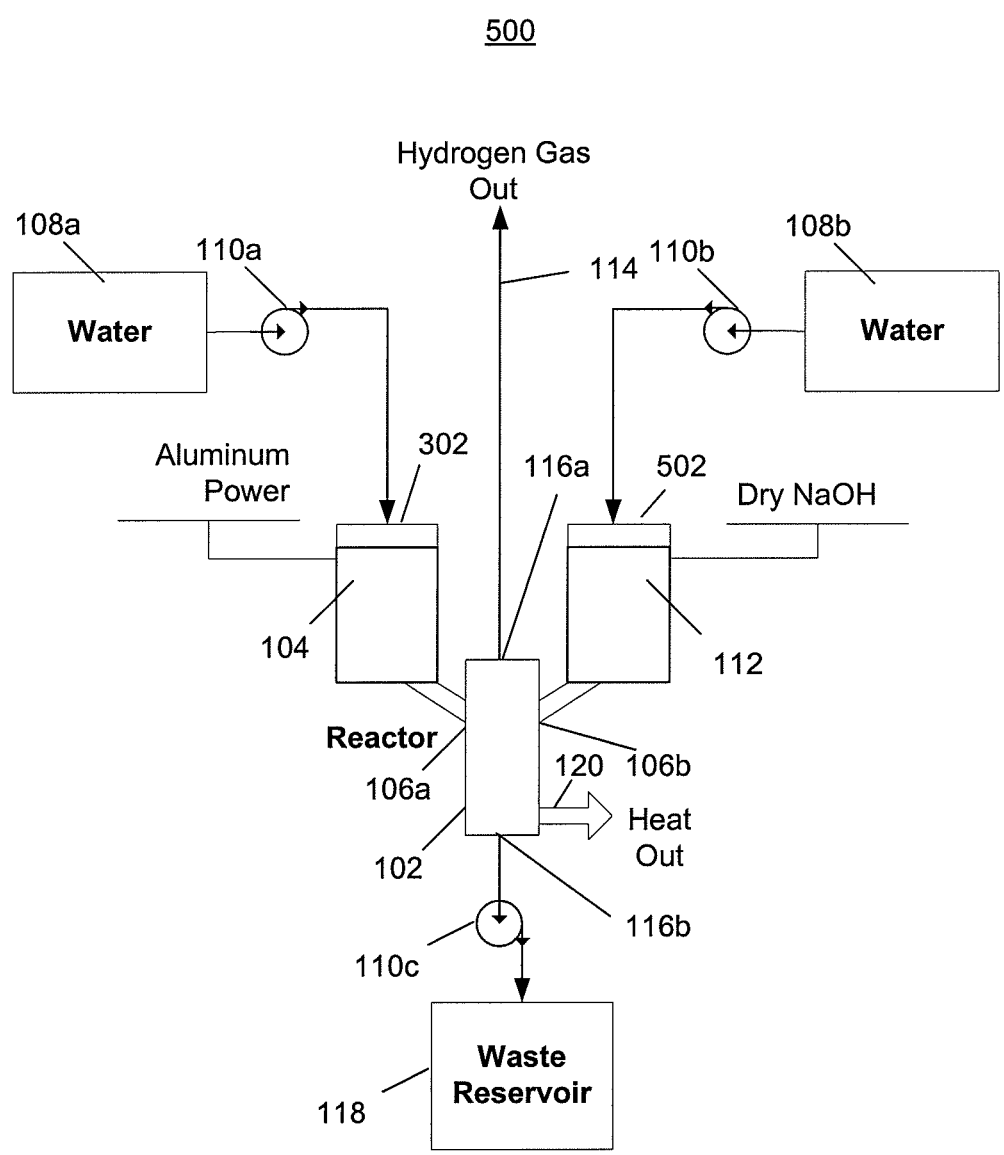
FIG. 5 depicts a fifth embodiment of a hydrogen generator having a chemical reactor that receives aluminum and water from a first inlet and sodium hydroxide and water from a second inlet, and outputs hydrogen, a waste solution, and heat.

FIG. 5 depicts a fifth embodiment of a hydrogen generator having a chemical reactor that receives aluminum and water from a first inlet and sodium hydroxide and water from a second inlet, and outputs hydrogen, a waste solution, and heat. Referring to FIG. 5, the hydrogen generator 500 includes a reactor 102, an aluminum source 104, a first water source 108a, and a first pump 110a that pumps water from the first water source 108a into the aluminum source via an first opening 302 such that aluminum and water are provided to the reactor 102 via a first inlet 106a, a dry NaOH source 112, and a second pump 110b that pumps water from the second water source 108b into the dry NaOH source 112 via an second opening 502 such that the NaOH and water are provided to the reactor 102 via a second inlet 106b. The hydrogen generator 400 outputs hydrogen 114 from a first outlet 116a, and a waste solution is pumped out of a second outlet 116b by a third pump 110c into a waste reservoir 118. Heat 120 produced by the chemical reaction is not captured and is instead allowed to escape into the surrounding environment.

The hydrogen generator 500 of FIG. 5 can combine the aluminum and water with the dry NaOH and water in various ways in order to achieve and control the substantially reactant-limited chemical reaction in accordance with the invention. In a first approach, a mixture of aluminum and water is provided to the reactor and then a mixture of dry NaOH and water is provided to the reactor, where the rate of introduction of the mixture of the dry NaOH and water into the reactor determines the rate at which hydrogen is generated. In a second approach, water and aluminum are mixed and provided to the reactor after the mixture of water and dry NaOH has been provided to the reactor, where the rate at which the mixture of aluminum and water is provided to the reactor determines the rate at which hydrogen is generated. In a third approach, the mixture of aluminum and water and the mixture of dry NaOH and water are provided to the reactor at the same time, where the rate of introduction of the aluminum and water mixture and rate of introduction of the NaOH and water mixture determines the rate at which hydrogen is generated. One aspect of the hydrogen generator 500 of FIG. 5 is that the force of the water being pumped into the aluminum source can be used to control the rate at which the combined aluminum and water are provided to the reactor and the force of the water being pumped into the dry NaOH source can be used to control the rate at which the combined dry NaOH and water are provided to the reactor.

Figure 6:
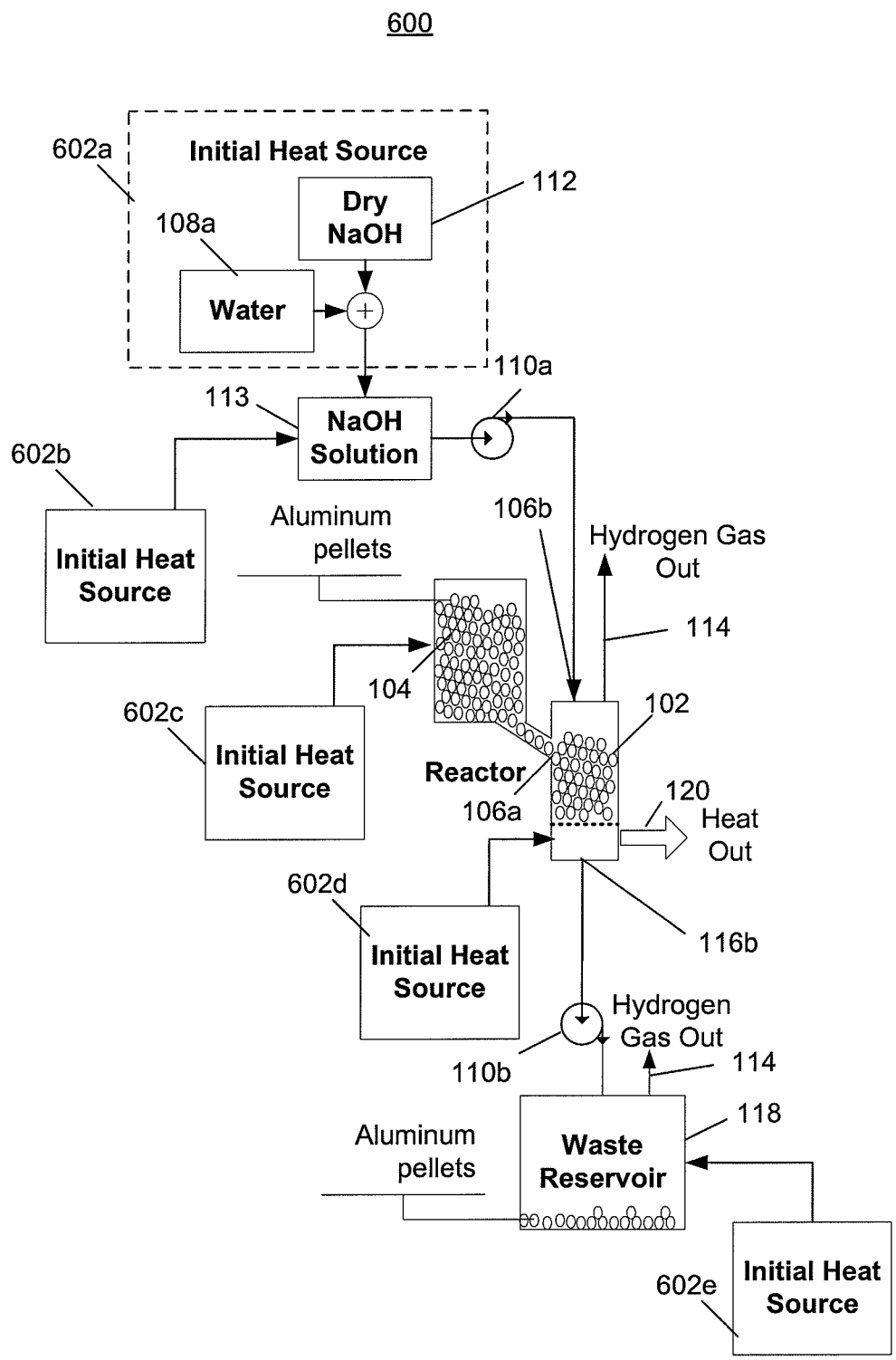
FIG. 6 depicts a sixth embodiment of a hydrogen generator having a waste reservoir configured to produce additional hydrogen from the waste solution and added aluminum, and also depicts alternative locations where an initial heat source can be applied to speed the chemical reaction in the chemical reactor and in the waste reservoir.

FIG. 6 depicts a sixth embodiment of a hydrogen generator 600 having a waste reservoir configured to produce additional hydrogen from the waste solution and added aluminum, and also depicts alternative locations where heat from an initial heat source can be applied to speed the chemical reaction in the chemical reactor and/or in the waste reservoir. Referring to FIG. 6, the hydrogen generator 600 is identical to the hydrogen generator 200 of FIG. 2 except that aluminum pellets are shown being included in the waste reservoir 118, which chemically react with the waste solution to produce additional hydrogen 114. FIG. 6 also depicts five locations for possible preheating by initial heat sources 602a-602e. The first initial heat source 602a is the heat created when Dry NaOH and water are mixed. If the mixing were to occur immediately before or as the resulting solution were pumped into the reactor than the heat produced by their mixing would serve to provide an initial heat that would speed up the chemical reaction. The NaOH can be heated by a second initial heat source 602b prior to or during it being pumped into the reactor 102. The aluminum in the aluminum source can be heated by a third initial heat source 602c and the reactor itself can be heated by an initial heat source 602d. Lastly, the waste reservoir can also be heated by an initial heat source 602e. One skilled in the art will also recognize that various piping, connections, pumps, and the like could define locations where heat from the initial heat source is applied. Such heat sources may include a hot water heater, a solar energy collector, etc. Generally, any sort of heat source can be used as an initial heat source in accordance with the invention.

Other embodiments of the present invention are shown by FIGS. 7-10. The heat generated by the hydrogen generators of these embodiments is used to drive a thermoelectric generator to provide electrical power for operating electrical components. The generated electrical power may be used to hydrolyze water to produce hydrogen gas and oxygen gas. To improve the efficiency of this process, the temperature of the reaction chamber may be controlled to the maximum efficiency point of the thermoelectric generator, for example by regulating the rate at which power is drawn from them and/or by the rate at which air is passed by the cold side of the thermoelectric generators. The hydrogen generated by hydrolysis may be added to the hydrogen generated from the reactant-limited chemical reaction process of the invention. The generated oxygen can be stored in a pressurized container to be used, for example, to enhance combustion or as the input to a fuel cell. As a combustion enhancer it may be stored until needed to supercharge the engine, for example, to provide power for passing another car in a vehicle application. This will obviate the need for a turbocharger and will allow a smaller horsepower engine to be used thereby improving fuel economy without sacrificing performance. In another embodiment the reaction heat may be used to heat or, through the use of a heat pump, cool the cabin of a vehicle. In yet another embodiment the heat may be generated while the car is not occupied in order to keep the engine and/or cabin warm in a cold climate. In this latter usage the generated hydrogen may also be combusted to augment the heat generation.

Figure 7:
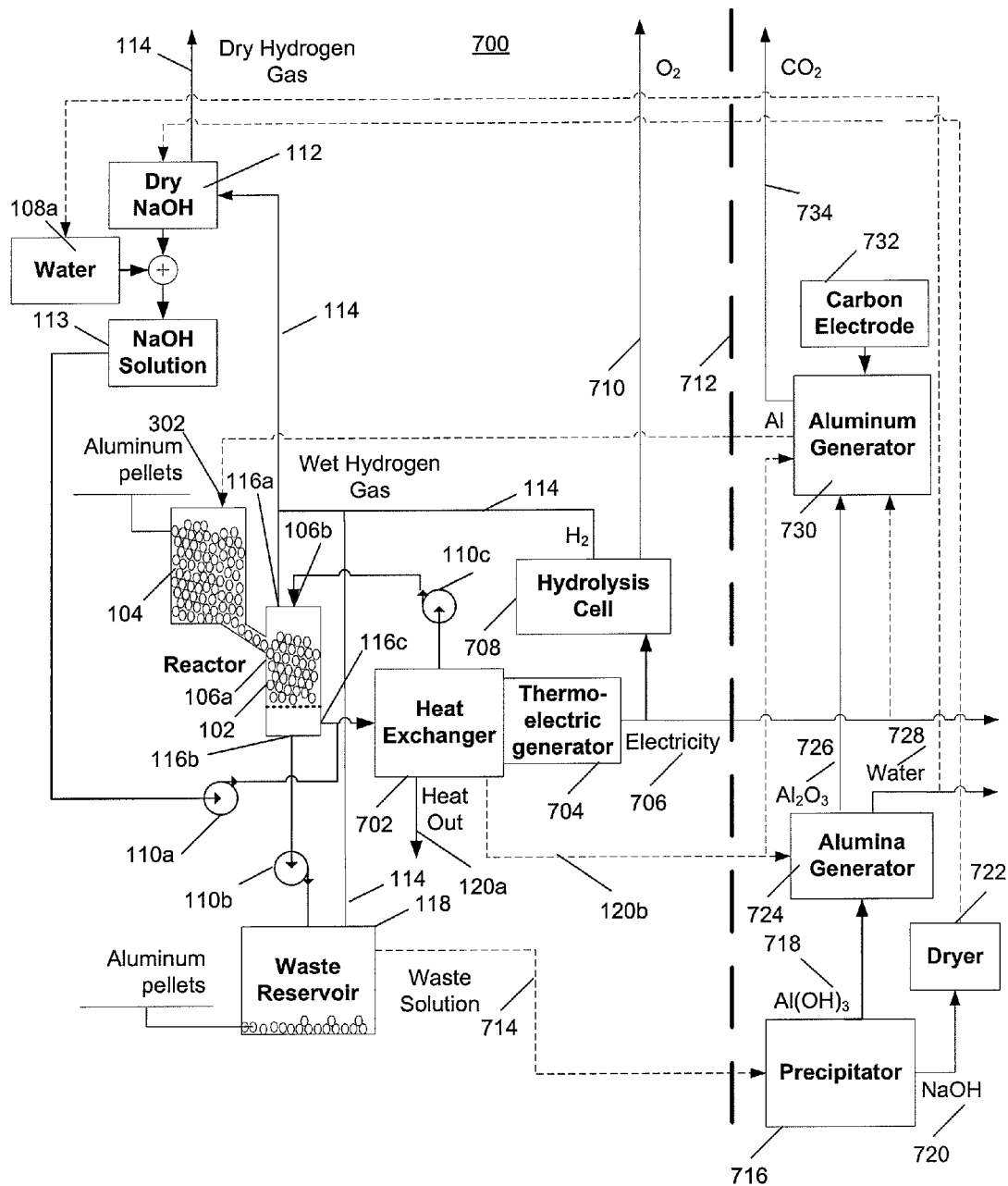
FIG. 7 depicts the hydrogen generator of FIG. 6 and various alternative embodiments of the invention that can be combined to produce a substantially recyclable hydrogen fuel system.

FIG. 7 depicts a hydrogen generator 700 similar to the hydrogen generator 600 of FIG. 6 having various alternative embodiments of the invention that can be combined to produce a substantially recyclable hydrogen fuel system. One variation of the hydrogen generator 700 is that before being provided to the reactor 102 the NaOH solution is first pumped by the first pump 110a into a heat exchanger 702 used to provide an initial heat source and also to remove heat from the reactor 702. A third pump 110c pumps the NaOH solution from the heat exchanger into the reactor 102 at the second inlet 106b. The NaOH solution reacts with the aluminum and the combined solution is cycled through the heat exchanger 702 thereby making the chemical reaction process more efficient. Heat 120a may be allowed to escape from the heat exchanger, which may be a open or closed vessel including a heat exchange fluid such as water, silicon, or oil and may involve metal such as the metal fins of a car radiator. Heat from the heat exchanger can also be converted by a thermoelectric generator 704 into electricity 706. The electricity 706 can be used for various purposes including driving a hydrolysis cell 708 that can produce additional hydrogen 114 to be combined with the hydrogen 114 produced by the reactor and the hydrogen 114 produced by the waste reservoir 118. The hydrolysis cell 708 also produces oxygen 710 that can be used along with the hydrogen 114 in a combustion engine. The oxygen 708 can also be used for the production of steel, plastics and textiles; rocket propellant; oxygen therapy; life support in aircraft, submarines, spaceflight and diving; and for many other purposes.

At the elevated temperature of the hydrogen generator operation the hydrogen will emerge "wet" (i.e., saturated with water vapor) and that is undesirable for many applications. FIG. 7 also depicts routing of the wet hydrogen gas that emerges from the reactor and waste reservoir through the source of dry sodium hydroxide 112 in order to dry the hydrogen 114 and also to partially hydrate the sodium hydroxide which is a necessary step to the production of the sodium hydroxide solution 113 needed to react with the aluminum in the generator.

In FIG. 7 there is a vertical dashed line 712 intended to indicate a current separation between processes that are currently scalable (i.e., can be implemented in small sizes, medium sizes, large scale industrial sizes), which are those to the left of the dashed line 712, and those processes that are large scale industrial processes that are not currently scalable but eventually may also be scalable, which are those to the right of the dashed line 712.

The recovery of the aluminum and NaOH from the waste solution 714 produced by the hydrogen generator requires large scale industrial processes. But, as the hydrogen generator technology of the present invention proliferates, it is likely that necessary investment capital will be expended to enable smaller scale recovery processes enabling small engines and the like that produce hydrogen to also recycle the waste in a very efficient manner. As such, the complete system anticipated by this invention involves the generation of hydrogen from water, aluminum, and sodium hydroxide using the disclosed reactant-limited chemical reaction and the recovery of the aluminum metal and sodium hydroxide from the sodium aluminate waste solution that results from the hydrogen producing reaction.

Referring again to FIG. 7, the sodium aluminate waste solution 714 produced by the reactor 102 is provided to a precipitator 716 that precipitates aluminum hydroxide (AL(OH)$_3$) 718 from the solution by adding seed crystals to the solution, which causes the aluminum hydroxide 718 to crystallize and precipitate leaving a solution of sodium hydroxide 720. The solution of sodium hydroxide is then dried by a dryer 722 and the dry sodium hydroxide can in turn be returned to service in hydrogen generators, such as the dry NaOH source 122 depicted in FIG. 7. The precipitated aluminum hydroxide 718 is then heated in an Alumina Generator 724 to produce alumina (Al$_2$O$_3$) 726 by driving out the water 728. Under one arrangement, at least part of the heat 120b used by the alumina generator 724 to produce the alumina 726 is provided by the heat exchanger 702. Under another arrangement, at least part of the heat 120b from the heat exchanger 702 is provided to the aluminum generator 730.

The aluminum metal is produced from the alumina by an aluminum generator 730 that uses the Hall-Héroult process, which involves dissolving the alumina into molten cryolite (sodium aluminum fluoride). In this process, electric current is used to electrolyze the solution as combined with a carbon source such as a carbon electrode 732 to produce molten aluminum, which can be provided to the aluminum source 104 of the hydrogen generator 700. Because the cryolite is not lost in the process, it may be used repeatedly.

The entire process of hydrogen generation through recovery of the reactants is highly reversible and electricity is the primary input to the process, although some electrode carbon is lost in the standard version of the Hall-Héroult process. Therefore, the economics and practicality of the invention reduces to the cost of electricity and transportation of the reactants to the consumer. In order to minimize the cost of the input electrical power, it is desirable that the aluminum and hydroxide recovery process be located near to the electrical power source.

For each of the embodiments of the hydrogen generator previously described, as the aluminum, water, and/or the dry NaOH is expended by the reactant-limited chemical reaction process, the aluminum source, water source, and/or the NaOH source can be refilled as needed, either continuously or in a batch process in which empty containers are simply refilled. In the continuous process, a hopper uses gravity or another force to feed the aluminum metal into the aluminum source. Similarly, gravity or another force can be used to feed the dry NaOH into the NaOH source. A water source may require refilling or be a water supply. The aluminum can be in any form such as rods, wires, powder, granules, tubes, pellets, etc. and the sodium hydroxide can be in the form of pellets, flakes, granules, etc.

The aluminum and sodium hydroxide may also be formed into a paste with a binder that keeps the aluminum and the hydroxide in a desired stoichiometric ratio. A binder such as a recoverable hydrocarbon may also substantially prevent water from reacting with aluminum and hydroxide. In this form, it can be readily handled and shipped as it is essentially waterproof. A binder can also be a water soluble binder or a solvent-soluble binder. One skilled in the art will recognize that there is virtually an unlimited amount of different chemical compounds that can be used as a binder. Exemplary binders include an anti-caking agent, a flowing agent, talcum powder, diatomaceous earth, calcium silicate, silica, calcium oxide, a silicone-based binder, a powdered sodium silicate, bismuth, a bismuth alloy, a paraffin, a thermoplastic, a thermo adhesive, a petroleum distillate, a rosin, a lead-based binder, an indium-based binder, or a wax. One skilled in the art will recognize that there is virtually an unlimited amount of different solvents that can be employed depending on what is used as a binder. Exemplary solvents that can be used to dissolve a solvent-soluble binder include an alcohol, a petroleum distillate, acetone, a chlorinated hydrocarbon, a detergent, keytone, an ester, an organic solvent, an acid, a terpene, a cyclic hydrocarbon, a polycyclic hydrocarbon, or an aldehyde.

Figure 8:
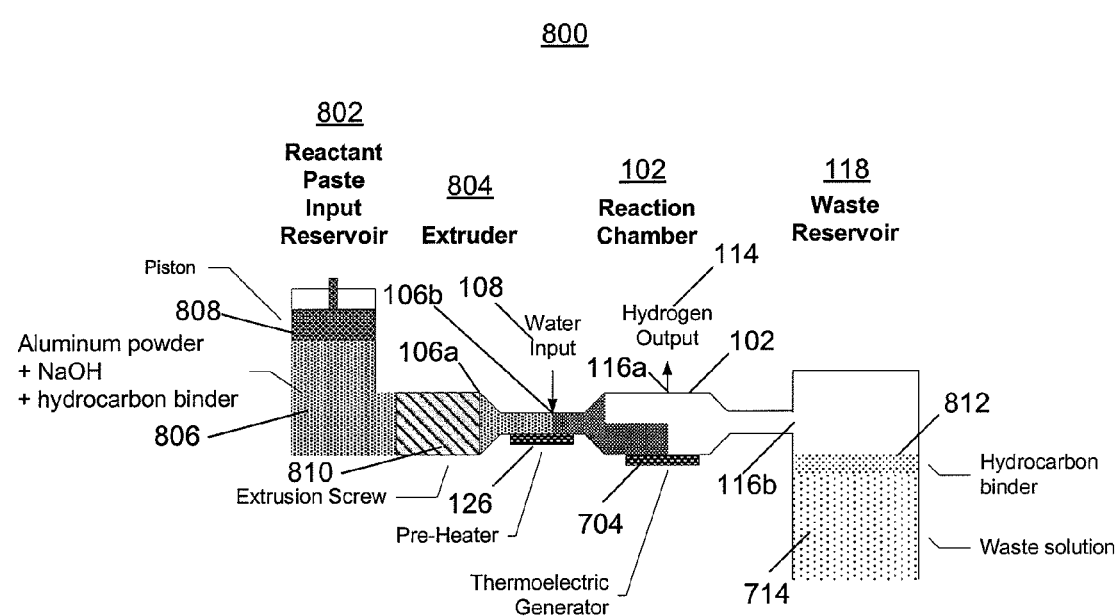
FIG. 8 depicts another embodiment of a hydrogen generator that combines a reactant paste of aluminum powder, sodium hydroxide, and a hydrocarbon binder with water to produce hydrogen.
Figure 9:
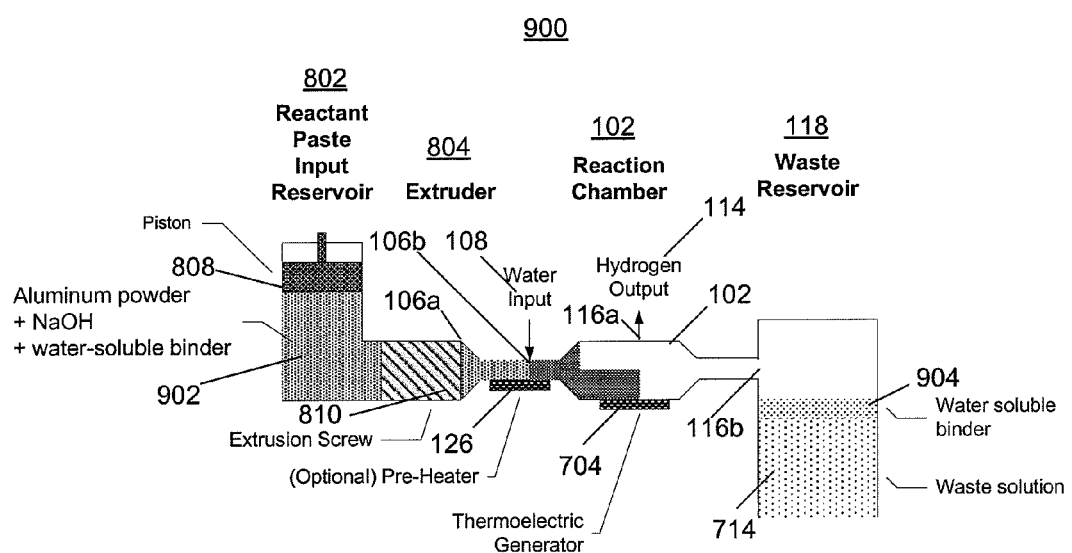
FIG. 9 depicts yet another embodiment of a hydrogen generator that combines a reactant paste of aluminum powder, sodium hydroxide, and a water soluble binder with water to produce hydrogen.
Figure 10:
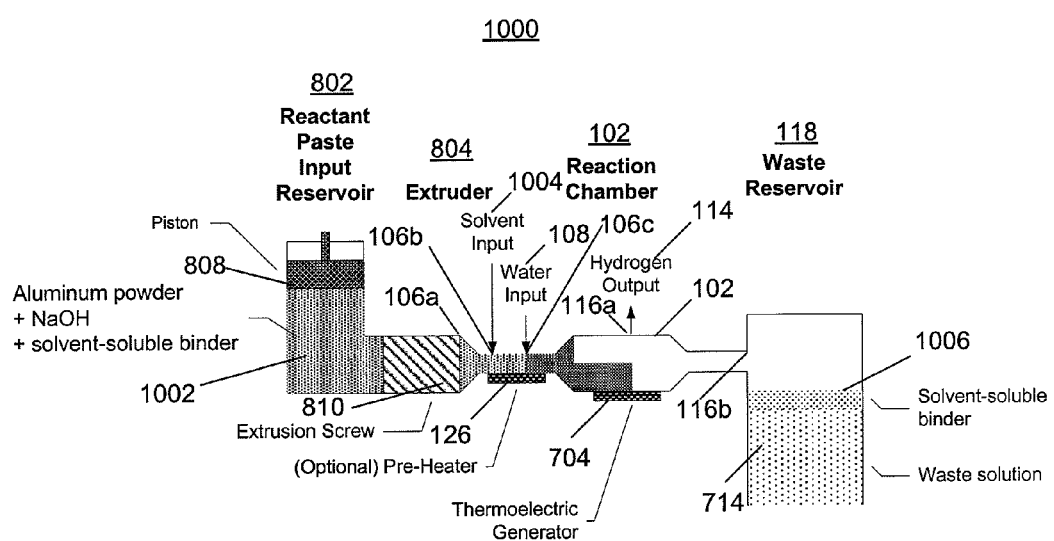
FIG. 10 depicts still another embodiment of a hydrogen generator that combines a reactant paste of aluminum powder, sodium hydroxide, and a solvent soluble binder with a solvent and water to produce hydrogen.

FIGS. 8-10 depict three additional embodiments of hydrogen generators that employ various types of pastes having different types of binders that can be used with aluminum and sodium hydroxide. FIG. 8 depicts another embodiment of a hydrogen generator 800 that combines a reactant paste of aluminum powder, sodium hydroxide, and a hydrocarbon binder with water to produce hydrogen. Referring to FIG. 8, the hydrogen generator has four basic components, a reactant past input reservoir 802, an extruder 804, a reaction chamber 102, and a waste reservoir 118. As depicted a paste 806 made up of aluminum powder, NaOH, and a hydrocarbon binder is placed into the reactant paste input reservoir 802. A piston 808 is used to provide the paste into an extrusion screw that provides the paste 806 into the reaction chamber 102 via a first inlet 106a. The reaction chamber is pre-heated by an initial heat source shown as pre-heater 126 because heat is required to remove the binder from the paste. Water is provided from a water source 108 into a second inlet 106b. The hot chamber melts the hydrocarbon binder, which then floats on top thereby exposing the reactants to the water, allowing the reaction to proceed to produce hydrogen 114 that exits a first outlet 116a. The waste solution and hydrocarbon binder exit the reaction chamber by a second outlet 116b into the waste reservoir 118. The hydrocarbon binder 1006 and the waste solution 714 can then be recovered from the waste reservoir 118. Also depicted in FIG. 8 is a thermoelectric generator 704, which can be used to convert heat into electricity as described in relation to FIG. 7. Additional components such as a hydrolysis unit 706 (shown in FIG. 7) could also be included with the hydrogen generator 800.

FIG. 9 depicts yet another embodiment of a hydrogen generator 900 that combines a reactant paste of aluminum powder, sodium hydroxide, and a water soluble binder with water to produce hydrogen. Referring to FIG. 9, the hydrogen generator 900 is very similar to the hydrogen generator 800 of FIG. 8 except that it uses a paste 902 made up of aluminum powder, NaOH, and a water-soluble binder. Because the binder is water-soluble, the pre-heater 126 is optional since heat is not required to remove the binder. Instead, the water provided from the water source 108 dissolves the water soluble binder 902 allowing the reaction to proceed to produce the hydrogen.

FIG. 10 depicts still another embodiment of a hydrogen generator 1000 that combines a reactant paste of aluminum powder, sodium hydroxide, and a solvent soluble binder with a solvent and water to produce hydrogen. Referring to FIG. 10, the hydrogen generator 1000 is very similar to the hydrogen generator 800 of FIG. 8 except that it uses a paste 1002 made up of aluminum powder, NaOH, and a solvent-soluble binder. Because the binder is solvent-soluble, the pre-heater 126 is optional since heat is not required to remove the binder. Instead, a solvent 1004 must be provided to remove the binder. As depicted, the solvent 1004 is added into the reaction chamber 102 via a second inlet 106b along with the water provided from the water source 108 via a third inlet 106c. The solvent dissolves the solvent-soluble binder 1002 allowing the reaction to proceed to produce the hydrogen. One skilled in the art will recognize that the solvent 1004 could be mixed with water to enable the water-solvent mixture to be provided to the reactor 102 via a single inlet. Alternatively, the solvent could be added to the paste prior to it entering the reactor. For example, the solvent could be added to the extruder 804 such that the binder is removed from the paste while it passes though the extrusion screw.

Figure 11:
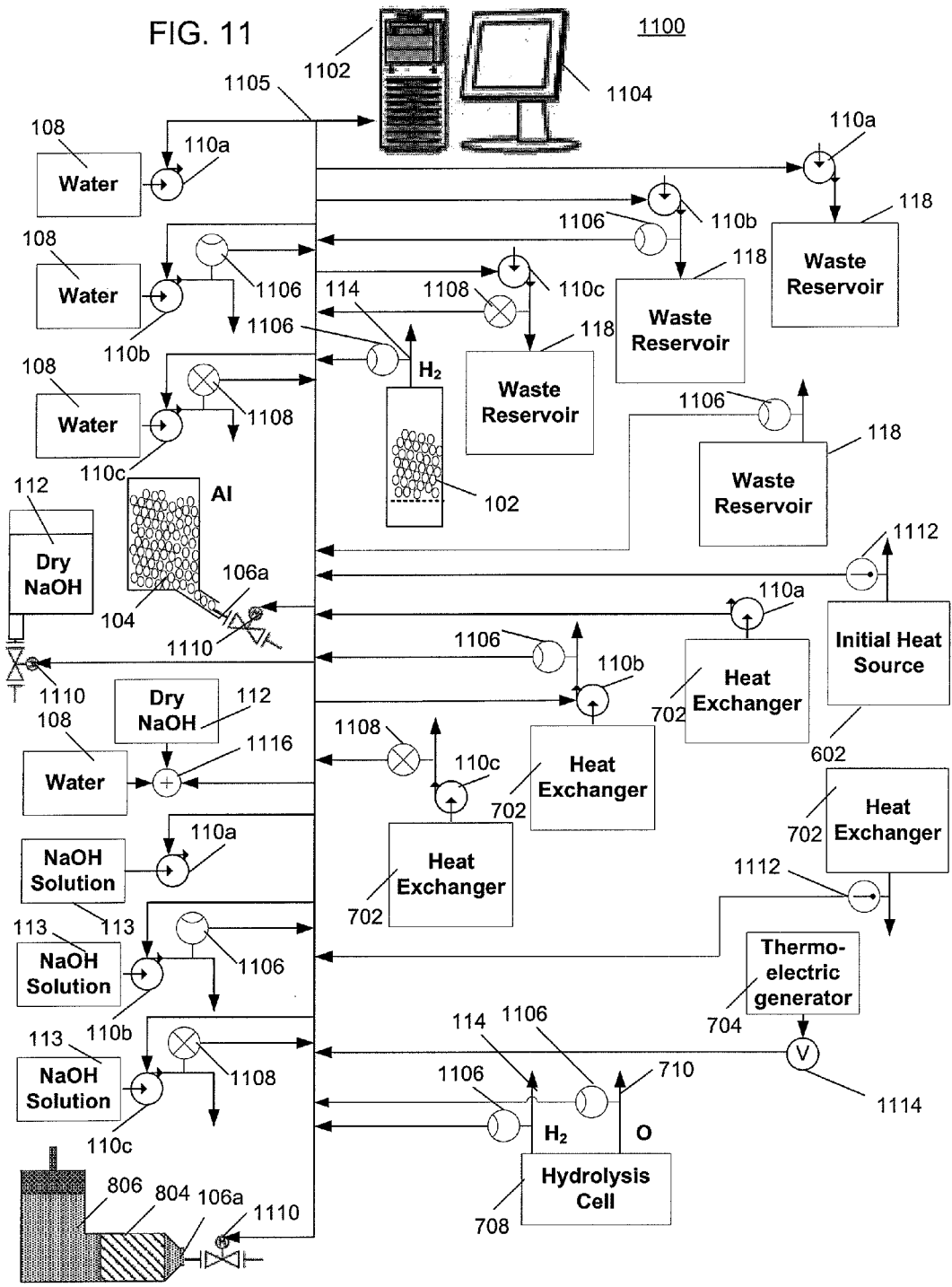
FIG. 11 depicts an exemplary control system intended to represent different types of sensors and control signals used to control the substantially reactant-limited chemical reaction of different types of hydrogen generators in accordance with the invention.

FIG. 11 depicts an exemplary control system intended to represent different types of sensors and control signals used to control the substantially reactant-limited chemical reaction of different types of hydrogen generators in accordance with the invention. Referring to FIG. 11, the control system 1100 includes a computing element such as a computer 1102 having a display 1104. The computing element is connected to a communications backbone 1105 used for sending control signals to and receiving sensor or measurement signals from various components of the hydrogen generator including pumps, valves, and various types of sensors. The communications backbone can be wired or wireless or a combination thereof. Three types of pumps are depicted including flow rate pumps 110a, mechanical pumps 110b, and pressure pumps 110c, where flow rate pumps 110a are sent a control signal establishing a desired flow rate, mechanical pumps 10b receive a control signal to control their operation based on a measurement received from a flow rate measurement device 1106, and pressure pumps 110c receive a control signal to control their operation based on a pressure measurement received from a pressure measurement device 1108. Use of the pumps 110a-110c and corresponding flow rate measurement devices 1106, and pressure measurement devices 1108 are depicted relative to water sources 108, NaOH solutions 113, waste reservoirs 118, and heat exchangers 702. Flow rate devices 1106 are also shown measuring the output of hydrogen 114 from a reactor 102 and from a waste reservoir 118 as well as measuring hydrogen 114 and oxygen 710 output from a hydrolysis cell 708. Flow control valves 1110 are shown receiving signals for controlling the rate of aluminum from an aluminum source 104 and a dry NaOH source 112 and also the rate of paste 806 (could also be 902 or 1002) exiting an extruder 804. Thermometers 1112 are shown providing a sensor signal indicating the temperature of the heat exiting an initial heat source 602 and the temperature of the heat exiting a heat exchanger 702. A voltmeter 1114 is shown providing a measurement signal indicating the amount of electricity produced by a thermoelectric generator. A signal is also shown controlling the mixing 1116 of dry NaOH and water. Generally, one skilled in the art will recognize that various types of control signals can be used to control the rate at which the reactants are provided to the reactor 102 based on sensor or measurement signals provided from various types of sensors and measurement devices conveying parameters related to the components making up one or more hydrogen generators in accordance with the invention.

Figure 12:
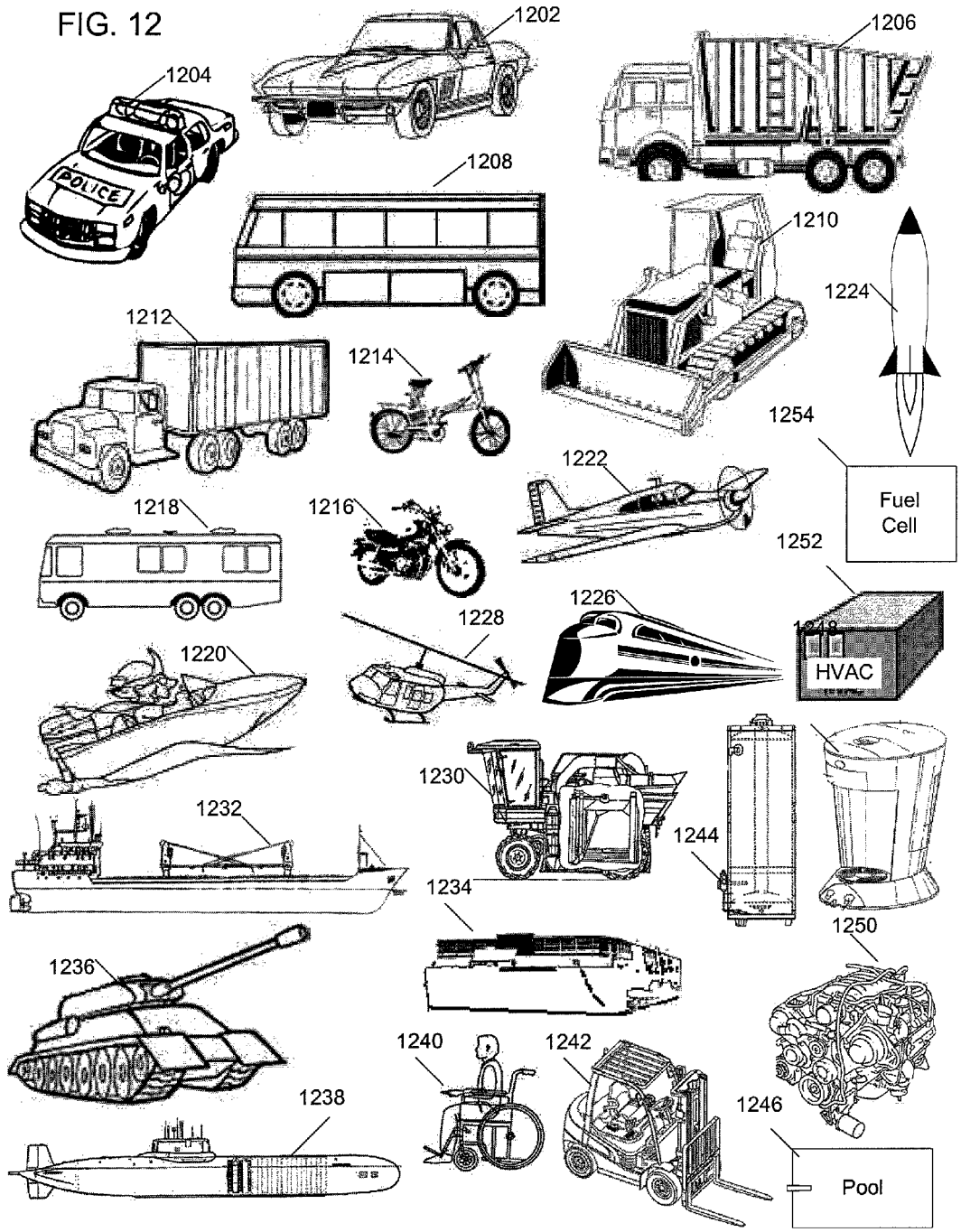
FIG. 12 depicts exemplary consuming apparatuses that can use the hydrogen generator of the invention.

FIG. 12 depicts exemplary consuming apparatuses that can use the hydrogen generator of the invention. Example consuming apparatuses depicted in FIG. 12 autos 1202, emergency vehicles 1204, trucks 1206, buses 1208, construction equipment 1210, semi-trucks 1212, bicycles 1214, motorcycles 1216, recreational vehicles 1218, inboard and outboard boat motors 1220, airplanes 1222, rockets 1224, locomotives 1226, helicopters 1228, farming equipment 1230, ships 1232, barges 1234, military equipment 1236, submarines 1238, wheel chairs 1240, forklifts 1242, industrial combustion engines 1250. The ability for subsequent generation of electricity from heat enables the electricity to be used for back-up power, trucking industry alternative power units, emergency generators, military applications, are other purposes. The heat produced by the invention can also be used to provide heat to an interior of a building a cabin of a vehicle, or to heat an engine 1250 in a cold environment. It can be used to heat water in a hot water heater 1244 or in a swimming pool 1246 and can be used to heat liquids (e.g., coffee) in small appliances 1248. Similarly, heat produced by the invention can be used to provide heat to a heat pump used to cool (i.e., via a HVAC unit 1252) an interior of a building, a cabin of a vehicle, or an engine, and can be used to cool water (e.g., in a water fountain) or other liquids. The hydrogen generator can also be used to supply hydrogen to a fuel cell 1254.

Although there may be one or more hydrogen generators used by a vehicle in accordance with the invention, in an exemplary embodiment of a vehicle fueling system there are two or more generators employed. In the case of a stationary use such as an electric generator it would be necessary to turn off the electric generator in order to refuel it unless the hydrogen is stored in a pressurized state. When more than one generator is employed in a system then an expended generator(s) may be replaced while another generator is still fresh, operational and providing a continuous supply of hydrogen. One skilled in the art will recognize that the ability to replace (or refill reactants for) one generator while another generator remains operational is an approach that is useful for applications other than vehicles.

The ability to use the invention to transfer electrical energy make it a transport mechanism that could be used to capture solar or wind power at remote locations without needing an electrical grid to bring the electric power to the users.

Figure 13:
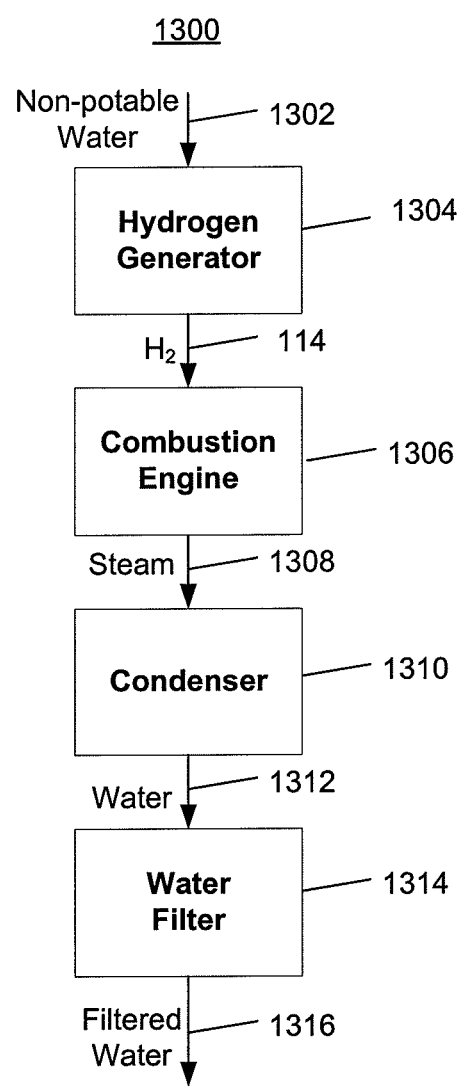
FIG. 13 depicts an exemplary water recovery system that uses the hydrogen generator of the invention.

The hydrogen generator of the invention can also be used as part of a water recovery system. FIG. 13 depicts an exemplary water recovery system 1300 that uses the hydrogen generator of the invention. Referring to FIG. 13, non-potable water 1302 is provided to a hydrogen generator 1304 that produce hydrogen 114 used to fuel a combustion engine 1306. The combustion engine 1306 outputs steam 1308 that is input into a condenser 1310 that outputs water 1312. The water 1312 if filtered by a water filter 1314 that outputs filtered water 1316.

While particular embodiments of the invention have been described, it will be understood, however, that the invention is not limited thereto, since modifications may be made by those skilled in the art, particularly in light of the foregoing teachings.

The invention claimed is:

1. A method for generating hydrogen for a consuming apparatus, comprising the steps of:
   providing an aluminum source for supplying aluminum;
   providing a hydroxide source for supplying a hydroxide;
   providing a water source for supplying water;
   providing a waste reservoir separate from said aluminum source, said hydroxide source, and said water source;
   providing a reaction chamber separate from said aluminum source, said hydroxide source, said water source, and said waste reservoir;
   combining a ratio of said aluminum, said hydroxide, and said water in said reaction chamber to cause a chemical reaction, said chemical reaction expending amounts of said aluminum, said hydroxide, and said water and outputting hydrogen, heat, and a waste solution in accordance with a reaction rate corresponding to a demand for said hydrogen by said consuming apparatus;
   providing an additional amount of at least one of said aluminum, said hydroxide, or said water to at least one inlet of said reaction chamber in accordance with said reaction rate to replace said expending amounts of said aluminum, said hydroxide, or said water as it is being expended;
   outputting in accordance with said reaction rate said waste solution from an outlet of said reaction chamber to said waste reservoir as said waste solution is being output by said chemical reaction, said at least one outlet being separate from said at least one inlet; and
   controlling the additional amount of at least one of said aluminum, said hydroxide, or said water provided to said reaction chamber and the output of said waste solution from said reaction chamber to said waste reservoir to maintain said ratio and control generation of said hydrogen in accordance with said demand for said hydrogen by said consuming apparatus.

* * * * *